United States Patent
Zhu et al.

(10) Patent No.: US 9,595,531 B2
(45) Date of Patent: Mar. 14, 2017

(54) ALUMINUM OXIDE LANDING LAYER FOR CONDUCTIVE CHANNELS FOR A THREE DIMENSIONAL CIRCUIT DEVICE

(71) Applicant: Intel Corporation, Santa Clara, CA (US)

(72) Inventors: Hongbin Zhu, Boise, ID (US); Gordon A Haller, Boise, ID (US); Fatma A Simsek-Ege, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/329,644

(22) Filed: Jul. 11, 2014

(65) Prior Publication Data

US 2016/0133640 A1   May 12, 2016

(51) Int. Cl.
*H01L 29/80*   (2006.01)
*H01L 27/115*   (2006.01)

(52) U.S. Cl.
CPC .. *H01L 27/11548* (2013.01); *H01L 27/11556* (2013.01); *H01L 27/11558* (2013.01)

(58) Field of Classification Search
CPC ............ H01L 21/8221; H01L 27/0611; H01L 27/0688; H01L 27/11514; H01L 27/11507–27/11536; H01L 27/11551; H01L 27/1156–27/1158; H01L 27/11597; H01L 27/1203; H01L 27/11548; H01L 27/11558; H01L 27/115
See application file for complete search history.

(56) References Cited

U.S. PATENT DOCUMENTS

| | | |
|---|---|---|
| 2010/0109065 A1 | 5/2010 | Oh et al. |
| 2010/0181612 A1* | 7/2010 | Kito ................. H01L 27/11551 257/319 |
| 2010/0240205 A1* | 9/2010 | Son .................. H01L 27/11551 438/588 |
| 2012/0199897 A1 | 8/2012 | Chang et al. |
| 2013/0044531 A1 | 2/2013 | Baek et al. |
| 2013/0307050 A1 | 11/2013 | Ahn et al. |
| 2014/0024189 A1 | 1/2014 | Kim et al. |
| 2014/0054670 A1 | 2/2014 | Lee et al. |

(Continued)

OTHER PUBLICATIONS

International Search Report and Written Opinion for PCT Patent Application No. PCT/US2015/037999, Mailed Sep. 30, 2015, 13 pages.

(Continued)

*Primary Examiner* — Cuong B Nguyen
(74) *Attorney, Agent, or Firm* — Compass IP Law

(57) ABSTRACT

A multitier stack of memory cells having an aluminum oxide (AlOx) layer as a noble HiK layer to provide etch stop selectivity. Each tier of the stack includes a memory cell device. The circuit includes a source gate select polycrystalline (SGS poly) layer adjacent the multitier stack of memory cells, wherein the SGS poly layer is to provide a gate select signal for the memory cells of the multitier stack. The circuit also includes a conductive source layer to provide a source conductor for a channel for the tiers of the stack. The AlOx layer is disposed between the source layer and the SGS poly layer and provides both dry etch selectivity and wet etch selectivity for creating a channel to electrically couple the memory cells to the source layer.

14 Claims, 11 Drawing Sheets

(56) References Cited

U.S. PATENT DOCUMENTS

2014/0193969 A1 7/2014 Hull et al.
2015/0279855 A1 10/2015 Lu et al.
2015/0325587 A1* 11/2015 Chen ................ H01L 27/11578
 257/314

OTHER PUBLICATIONS

Search Report of R.O.C. Patent Application No. 104120306, English Translation, Completed Jul. 11, 2016, 1 page.

* cited by examiner

ALUMINUM OXIDE LANDING LAYER FOR CONDUCTIVE CHANNELS FOR A THREE DIMENSIONAL CIRCUIT DEVICE

FIELD

Embodiments of the invention are generally related to three dimensional circuit devices, and more particularly to providing an aluminum oxide landing layer for creating conductive channels for a three dimensional circuit device.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

There is a general desire for continually smaller size for computing and electronic devices and components, even as higher performance and storage capacity is expected from the devices. Additionally, the more discrete circuit components and the greater the real estate used, the more the devices consume power. Size and power consumption are significant factors in electronics and memory devices, especially for handheld and mobile applications. Recent developments in device manufacturing offer three dimensional circuit structures to create electronic devices that have higher densities. However, the physics of various materials and processing techniques introduce failures and performance limitations on resulting high density devices that prevent the viability of such devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
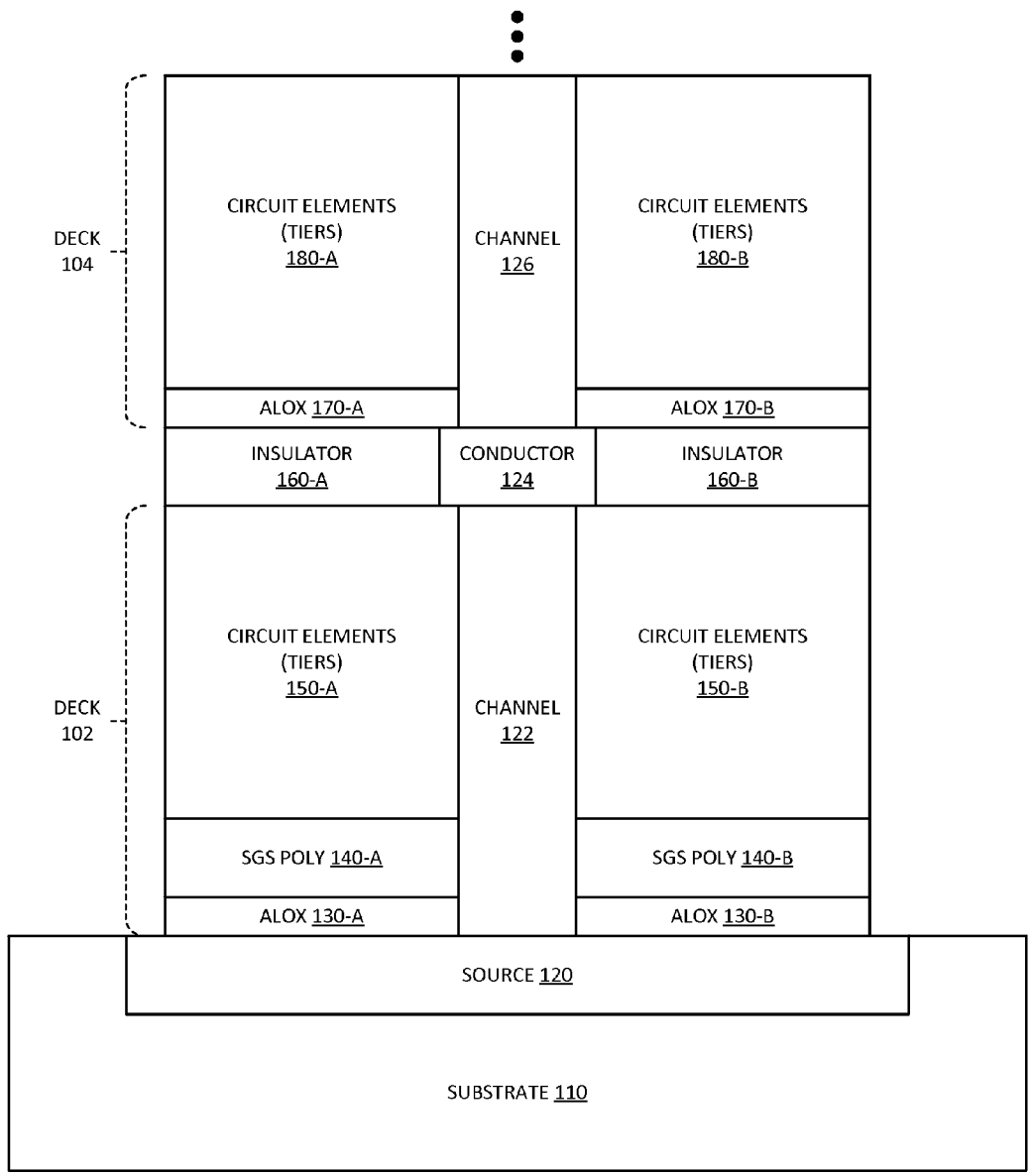
FIG. 1 is a block diagram of an embodiment of a stacked circuit with an AlOx landing layer.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a multitier stack of circuit elements includes an aluminum oxide (AlOx or ALOX) layer as a noble HiK layer to provide etch stop selectivity. The multitier stack enables higher density electronic components, by sharing a common source for multiple tiers of circuit devices. Applications of multitier stacking include memory devices, where multiple tiers each including memory cells can be vertically stacked. Other applications and other configurations are possible.

In one embodiment, each tier of the stack includes a memory cell device or multiple memory cell devices. A circuit using such a multitier stack can include a source gate select polycrystalline (SGS poly) layer adjacent the multitier stack of memory cells, where the SGS poly layer can provide a gate select signal for the memory cells of the multitier stack. The circuit also includes a conductive source layer to provide a source conductor for a channel for the tiers of the stack. Thus, the multiple memory cells can each be coupled to the source. The AlOx layer is disposed between the source layer and the SGS poly layer and provides both dry etch selectivity and wet etch selectivity. The etch selectivity enables more effective processing of a channel to electrically couple the memory cells to the source layer.

In one embodiment, each tier includes NAND memory cells. Thus, the circuit device is a three dimensional (3D) memory device. In one embodiment, the processing builds a hollow channel the multiple tiers. The chemistry traditionally used in creating such pillars has limitations on creating a desired pillar profile with multiple tiers of circuit elements. In particular, creating a multitier stack of circuit elements is traditionally limited by a lack of etch uniformity (e.g., etch depth, etch undercut). For example, in the case of many tiers of wordlines stacked together in a memory device, a pillar needs to be processed with an aspect ratio higher than can traditionally be achieved.

Other approaches to creating stacked or multitier circuits (also referred to as three dimensional or 3D circuits) include a layer of material with a high dielectric constant (a HiK material). Such a layer of material was traditionally placed between the SGS poly and the tiers of circuit elements, rather than between the SGS poly and the source. HiK materials provide electrical isolation within a circuit to reduce leakage. Examples of HiK materials that have been attempted include HfOx, ZrOx, and TanOx. It will be understood that chemical formula representations such as HfOx, ZrOx, TanOx, and AlOx (and others that might also be used) are generic representations of an oxide compound rather than a specific chemical formula. Each representation refers to an oxide compound that includes at least one atom of the first element with at least one atom of oxygen. The exact numbers of atoms of each element could vary by implementation and/or processing technique. AlOx is a HiK material that provides good dielectric properties to a circuit and provides much better etch properties than other HiK materials. The other HiK materials indicated do not provide good properties for cleaning the material or allowing wet etched selectivity relative to standard silicon-based oxide or polysilicon materials. Other materials result in a conductive channel with a diameter that narrows significantly the closer the channel is to the source. Also or alternatively, other materials allow undercut etching that results in channel to channel shorts. Thus, the other materials do not result in a sufficiently straight pillar. Such pillar imperfections can result in memory cell disturb and/or shorts between different circuit elements.

AlOx can be considered a "noble HiK" material in the sense that it provides good dielectric isolation, while providing etch selectivity. In particular, AlOx can provide both wet etch selectivity as well as dry etch selectivity. For example, AlOx offers good selectivity relative to polysilicon materials and to oxides used in a wordline stack. Such selectivity can improve the SGS poly profile and improve etch landing to provide contact by a channel with the source conductor layer. Thus, AlOx can provide less program disturb and lower trap up. The resulting pillars have a more uniform diameter than is possible with traditional processing techniques. The use of an AlOx layer as described can also increase string current in the channel conductor and reduce variation in the select gate threshold voltages (SG-Vt). Additionally, the AlOx layer can provide improved pillar to pillar continuity in applications where multiple decks of multitier layers are implemented.

The following descriptions refer to the accompanying drawings. It will be understood that the drawings do not necessarily set out elements or components to scale. Certain elements are intentionally drawn out of proportion for purposes of illustration and discussion. It will also be understood that specific examples refer to vertical stacking of decks, one on top of the other. In one embodiment, the circuits could be configured horizontally.

FIG. 1 is a block diagram of an embodiment of a stacked circuit with an AlOx landing layer. System 100 represents an electronic circuit device that uses multiple decks of circuit element tiers. Instead of processing all circuit elements in a single stack and attempting to create a channel to operate all the circuit elements, system 100 is processed in layers, with multiple decks of circuit elements.

Substrate 110 represents a substrate or semiconductor platform on which the electronic circuit is processed. System 100 represents a cross section of the electronic circuit, and it will be understood that typically many such circuits would be processed simultaneously on a semiconductor wafer. The processing creates (e.g., deposits) source conductor 120 in or on substrate 110. Source conductor 120 can activate or control the circuit operation of the circuit elements of system 100. Source conductor 120 is a highly conductive material, such a metallic material (e.g., tungsten silicide (WSix)) or other material with many high-mobility carriers. In one embodiment, source conductor 120 includes multiple layers of material (for example, a WSix layer and a highly doped poly layer). It will be understood that not all circuit elements for a functional circuit are illustrated in system 100.

ALOX (elements 130-A and 130-B) can provide an electrical barrier between source 120 and the source gate layer, SGS poly 140 (elements 140-A and 140-B). Deck 102 includes circuit elements 150 (elements 150-A and 150-B) which are activated by SGS poly 140. It will be understood that while shown as elements 'A' and 'B,' deck 102 can include multiple circuit elements 150 that are separately activated by SGS poly 140 via channel 122. The labels of 'A' or 'B' are only for illustrative purposes. Circuit elements 150 are created in tiers within deck 102. Thus, multiple circuit elements 150 can be stacked adjacent (e.g., vertically adjacent) to each other within deck 102. Deck 102 can include anywhere from a few circuit elements to dozens of circuit elements (e.g., 36 or 38 memory cells). Channel 122 extends the entire height/length of deck 102 to source 120, thus providing electrical connectivity from source 120 to circuit elements 150. Channel 122 extends from one end of the deck to the other end of the deck (e.g., top to bottom in a vertical stack, or side to side in a horizontal stack/row).

In one embodiment, system 100 includes multiple decks, as illustrated by deck 104, which is built or processed adjacent to deck 102. Deck 104 includes circuit elements 180 (elements 180-A and 180-B). In one embodiment, deck 104 includes ALOX 170 (elements 170-A and 170-B) on insulator 160 that separates deck 104 from deck 102. In one embodiment, circuit elements 150 and 180 are each stacked vertically as tiers of circuit elements within their respective decks. In one embodiment, the processing that creates circuit elements 180 is the same as the processing that creates circuit elements 150, but performed in a different deck separated by certain decks processing operations.

In one embodiment, the processing creates insulator 160 (elements 160-A and 160-B) on deck 102 to provide a separator on which deck 104 can be processed. Conductor 124 is processed at the end of channel 122, and provides electrical connectivity of channel 126 of deck 104 to channel 122 of deck 102, and thus to source 120. It will be understood that when source 120 is a metallic layer, the processing can include etching processes that will produce a good pillar with uniform properties to be able to generate channels 122 and 126, with conductor 124 being a highly conductive material or metallic material.

ALOX 130 and ALOX 170 can provide landing layers for an etching process that creates pillars for channels 122 and 126, respectively. Thus, ALOX 130 and/or ALOX 170 can enable the processing of system 100 to achieve highly selective etching operations. ALOX 130 can enable good electrical contact by channel 122 to source 120. ALOX 170 can enable good electrical contact by channel 126 to conductor 124. In one embodiment, the processing of system 100 includes multiple etch operations, which can include dry etch and/or wet etch processes. The ALOX provides highly selective etching characteristics for both wet and dry etch. Referring specifically to deck 102, in one embodiment, ALOX 130 provides an etch stop layer for a channel etch that etches through the multitier stack of circuit elements 150. ALOX 130 can stop the etch at the ALOX layer without exposing source 120. The processing can selectively etch ALOX 130 with a gate etch to etch gate contacts for circuit elements 150 and ALOX 130 to expose source 120.

System 100 explicitly illustrates two decks, deck 102 and deck 104. It will be understood that the separation of the elements in the different decks, as well as the high conductivity of the hollow channels and stop layer connecting the decks theoretically allows any number of decks to be stacked in system 100. Thus, the total number of circuit elements in system 100 can be doubled, tripled, or more, relative to what the real estate would traditionally allow, based on the stacking. It will be understood that the selective etching described herein can be performed for deck 102, and system 100 does not necessary have other decks (i.e., deck 104 is optional). In one embodiment where deck 104 is processed, the processing for deck 104 does not necessarily use ALOX 170, but may be able to use another insulator if there is not a poly layer in deck 104.

FIGS. 2A-2F are block diagrams of an embodiment of various stacked stages of a stacked circuit with an AlOx etch selectivity layer. For purposes of example, FIGS. 2A-21 illustrate a three-dimensional stacked memory device, with multiple tiers of memory cells. Specifically, the example in FIGS. 2A-2F provides one example embodiment of a vertically stacked memory device. In one embodiment, such processing can occur in a "horizontal" manner, but for a device that is stacked out from a semiconductor substrate or wafer. Thus, in one embodiment, "vertical" stacking can refer to any processing that extends circuit elements out or up and away from the semiconductor substrate on which the devices are processed and/or placed for operation. The processing includes an AlOx layer to provide selective etching capability.

Figure 2A:
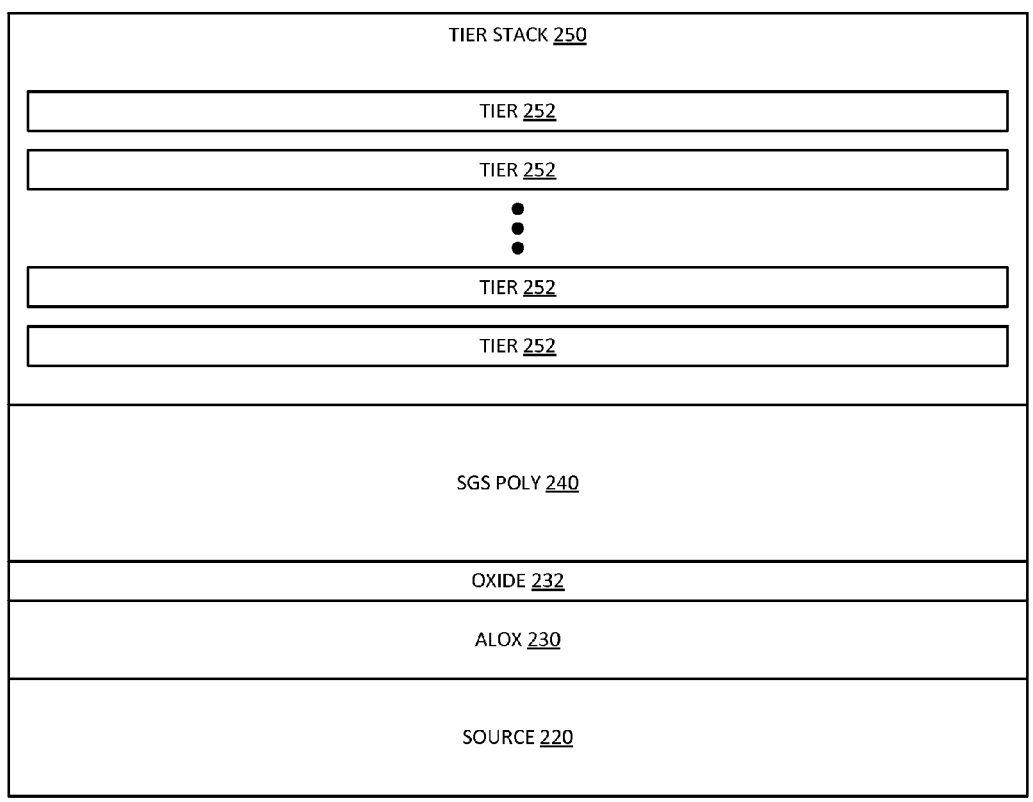
FIGS. 2A-2F are block diagrams of an embodiment of various stages of a stacked circuit with an AlOx etch selectivity layer.

FIG. 2A illustrates circuit state 202, in which multiple circuit element tiers 252 are processed over source 220. In one embodiment, ALOX 230 is processed on source 220. In one embodiment, there is an oxide layer between source 220 and ALOX 230. In one embodiment, oxide layer 230 is processed on ALOX 230, between ALOX 230 and SGS poly 240. An oxide layer between ALOX 230 and source 220 or between ALOX 230 and SGS poly 240 can provide further control over the etch profile of a pillar processed through the layers to source 220.

In one embodiment, source layer 210 includes one or more layers of material. For example, source 220 can include tungsten silicide (WSix), heavily doped polysilicon, poly-tungsten silicide, and/or other highly conducting materials. In one embodiment, source 220 includes a free-carrier conductor, such as an n-type doped polysilicon. It will be understood that n-type materials have free electrons that provide current flow (by providing charge), while p-type materials have free holes that provide current flow (by receiving charge). In one embodiment, SGS poly 240 includes a p-type doped polysilicon. Tier stack 250 with multiple tiers 252 are processed on SGS poly 240. Tier stack 250 can include alternating layers of insulator material (e.g., oxide) and conductive material (e.g., doped poly).

Figure 2B:
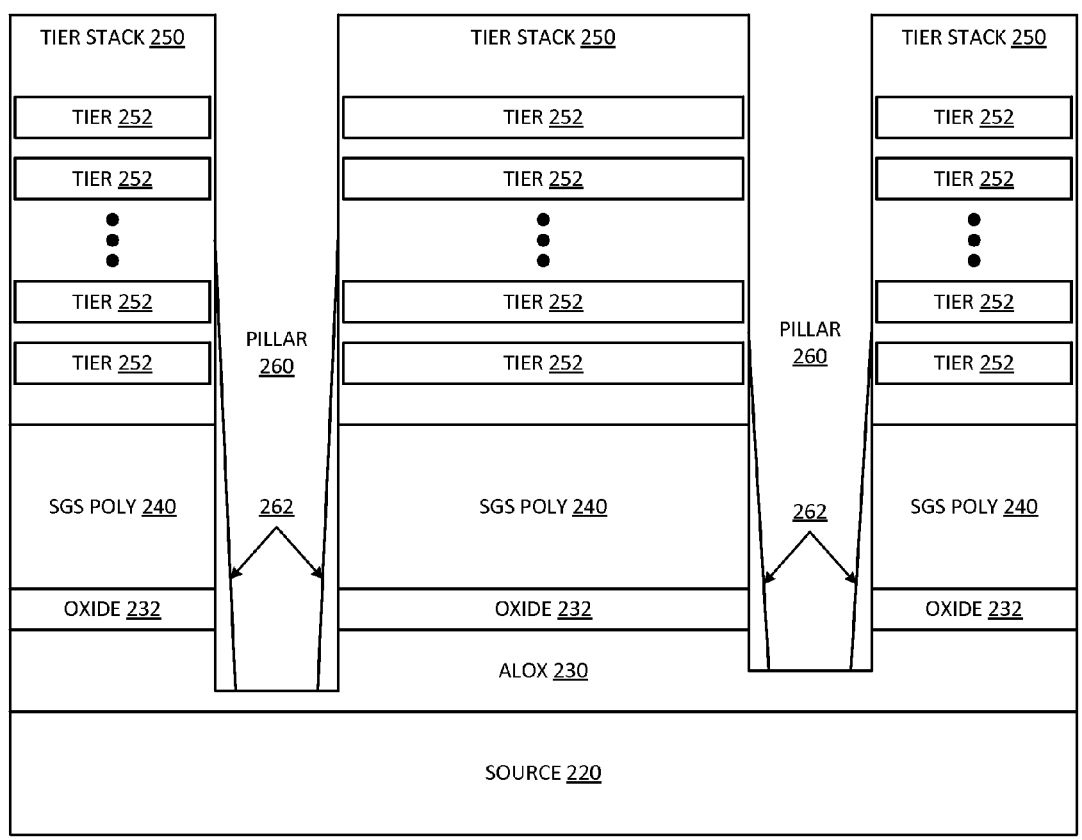

FIG. 2B illustrates circuit state 204, in which the processing creates one or more pillars for channel conductors. In one embodiment, one or more pillars 260 are created by a punch etch, which creates an opening through tier stack 250, through SGS poly 240, through oxide 232, and into ALOX 230. ALOX 230 can provide an etch stop layer for forming pillar 260. By placing ALOX 230 between SGS poly 240 and source 220, instead of between SGS poly 240 and tier stack 250 as traditionally done, the processing can improve the SGS profile by approximately 20 to 40 percent. Such a profile improvement refers to a uniformity of the diameter of pillar 260 through SGS poly layer 240. Additionally, the selectivity of ALOX 230 with the ALOX layer closer to source 220 can improve the diameter of pillar 260 near the source by approximately 50%, which provides a much better profile for the conductor.

As represented in circuit state 204, pillar 260 can etch into ALOX 230 and stop within the ALOX layer without etching into source 220. In one embodiment, pillar 260 can be etched into ALOX 230 by a dry etch process. Thus, ALOX 230 can provide a dry etch landing window for very high aspect ratio structures (e.g., an aspect ratio of approximately 25) without pitting into source 220. After etching pillar 260 into ALOX 230 (e.g., after a dry etch process), pillar 260 could be etched anywhere within ALOX 230, depending on stack variation in manufacturing and/or processing. As illustrated with the two different pillars 260 represented, the etching into the ALOX can deeper or shallower into different pillars within the same device, and can etch a different amount into the ALOX with the same process on different devices.

Circuit state 204 also represents processing residuals 262. Residuals 262 represent material that can sputter back into pillar 260 during the etching. For example, during dry etch, material from ALOX 230 can sputter back into pillar 260. HiK residuals in pillar 260 can block the consecutive integration processes and cell formation unless they are cleaned from the inside of pillar 260.

Figure 2C:
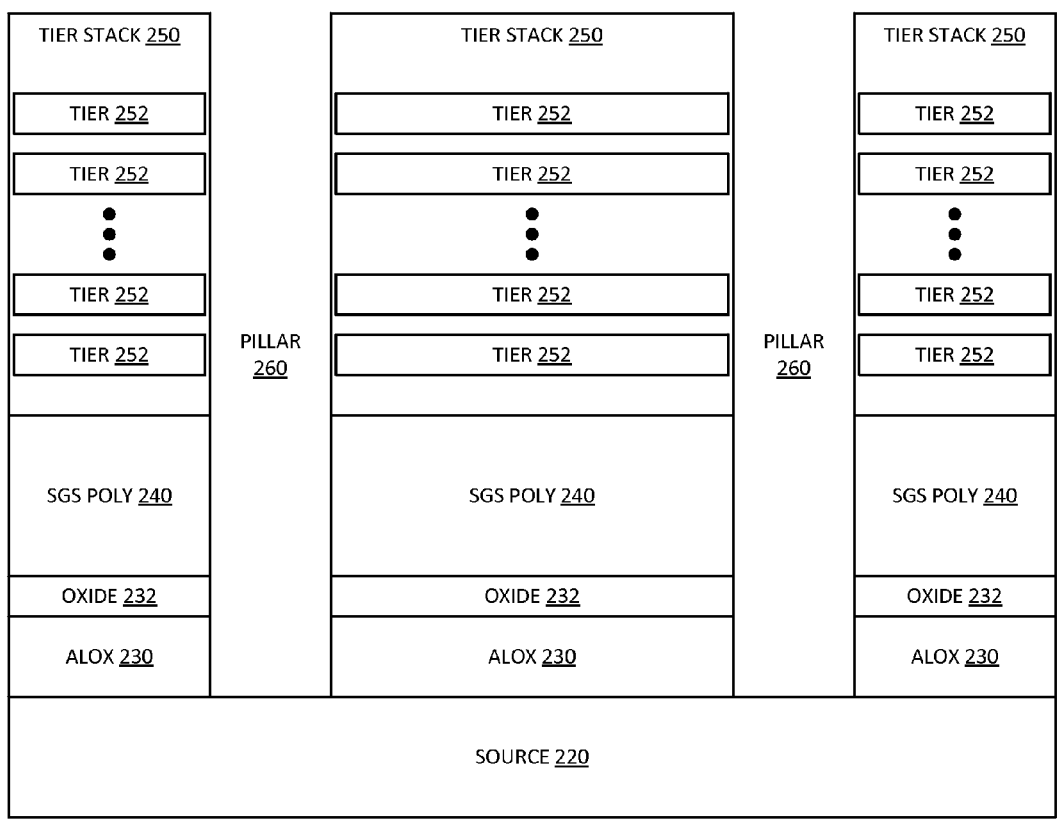

FIG. 2C illustrates circuit state 206, in which the processing cleans pillar 260 and exposes source 220. As mentioned above with respect to FIG. 2B, completion of the etch process can result in residual material within pillar 260, and the pillar is not completely etch through ALOX 230 to source 220. In one embodiment, the processing includes a wet etch process to follow up a dry etch process to make contact to source 220. In one embodiment, ALOX 230 is or includes amorphous ALOX. In such an embodiment, conventional wet etch techniques such as HF (hydrofluoric acid etch) and BOE (buffered oxide etch, which includes a buffering agent used with an etching chemical), can clean up sputtered material very cleanly, as well as providing high selectivity to expose source 220.

Use of ALOX 230 as a HiK material layer between source 220 and SGS poly 240 can provide 50:1 HF clean selectivity, and approximately 100:1 BOE clean selectivity. Additionally, ALOX 230 can provide 10:1 dry etch selectivity as compared to the poly of SGS poly 240 and/or oxide 232. The relative selectivity can be true of ALOX 230 even in amorphous form. In one embodiment, the wet and dry etch selectivity of ALOX 230 can be increased by approximately 3× by crystallizing an ALOX film at high temperatures (e.g., in the range of 950-1100 C). Such crystallizing can provide additional integration benefits for consecutive process operations or steps, for example, when it is desired for the ALOX layer to not be etched or cleaned from certain parts of the device.

Figure 2D:
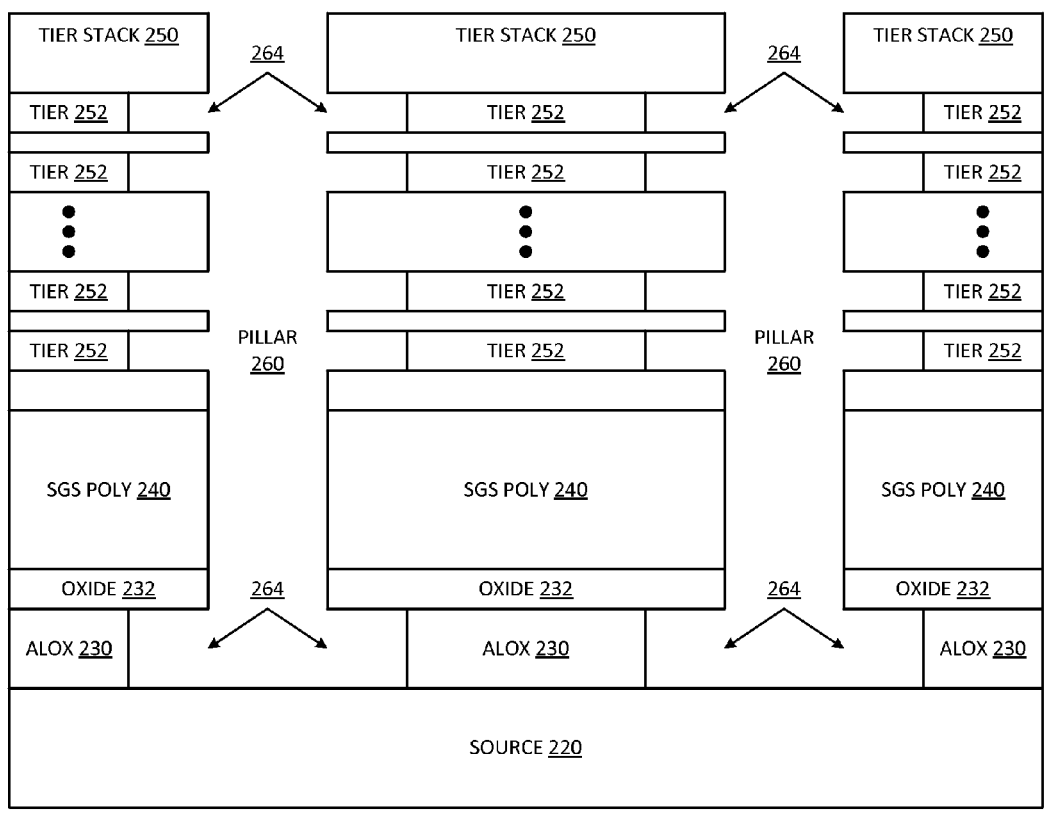

FIG. 2D illustrates circuit state 208, in which the processing recesses the tiers for floating gate processing. In one embodiment, the processing recesses ALOX 230 for floating gate processing as well. In one embodiment, the processing does not create a floating gate within the ALOX layer. The processing creates recesses 264 into each tier 252. In one embodiment, the processing creates similar recesses into ALOX 230. The recesses can be created, for example, by an etch operation. In one embodiment, the etch operation that creates recesses 264 can be the same process used to clean ALOX residuals from pillar 260, and the continuation of the process can create the recesses.

Figure 2E:
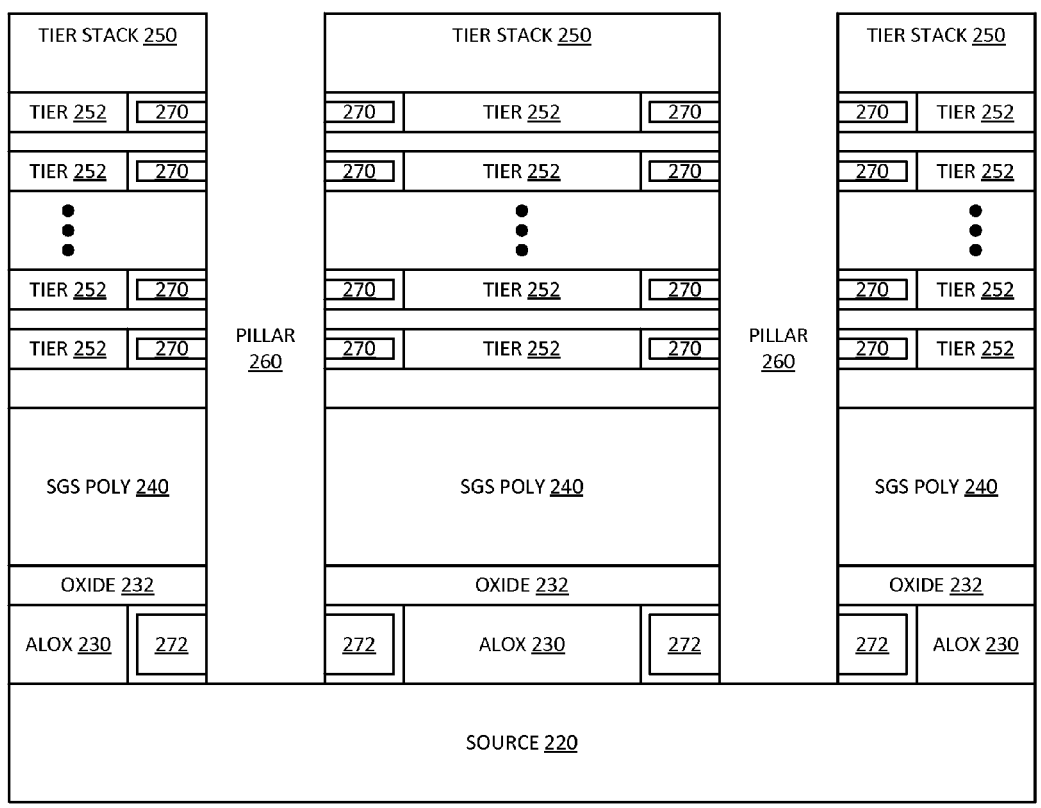

FIG. 2E illustrates circuit state 210, in which the processing creates floating gates 270 in tiers 252. In an embodiment where the processing also creates a floating gate in ALOX 230, the processing creates dummy floating gate 272 in ALOX 230. Floating gates 270 are operationally functional, and thus they operate as gates in response to a select signal. Dummy floating gate 272 can also operate in response to a select signal, and can be functionally active in the sense of increasing current flow when activated, but is not operationally functional in the same sense as floating gates 270, in that ALOX 230 does not include a memory cell or other circuit element triggered in response to a select gate signal.

Figure 2F:
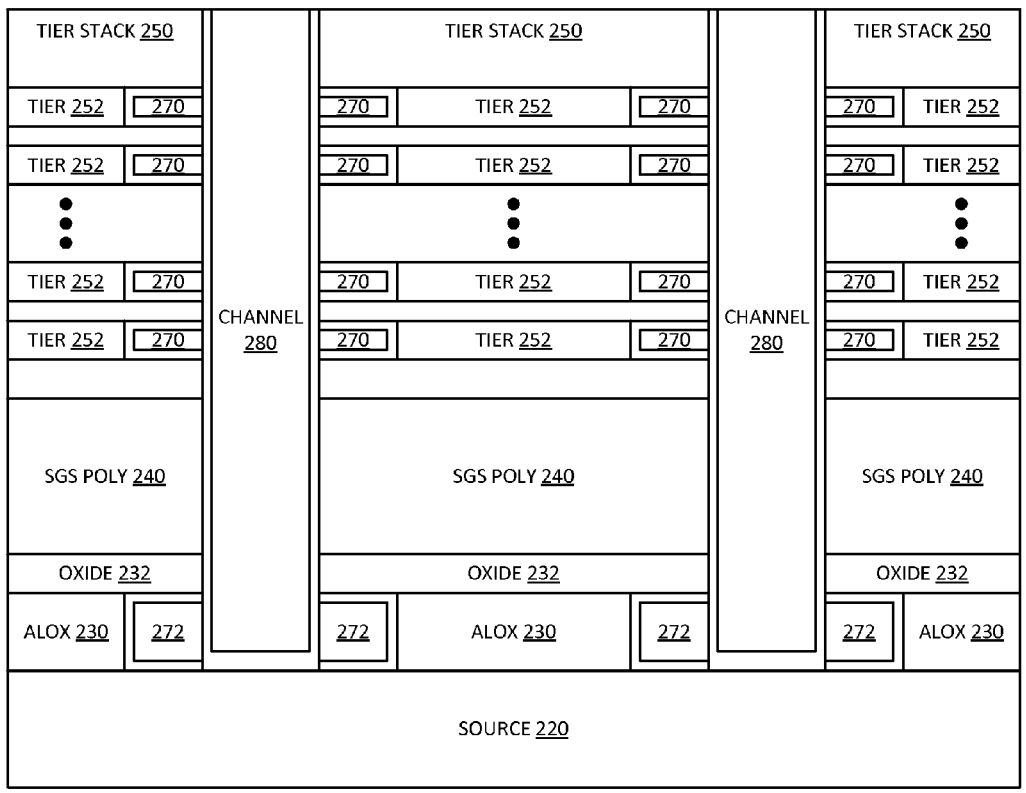

FIG. 2F illustrates circuit state 212, in which the processing creates a conductor channel in the pillars. Channel 280 represents a pillar with a conductor created on the walls and the base (the part closest to source 120) of pillar 260 (shown in the drawings above). In one embodiment, channel 280 is filled with an insulator (e.g., oxide) that the conductor surrounds, and can thus be referred to as a hollow channel. A hollow channel conductor refers to a pillar with a thin layer of conductor on the walls (e.g., thin enough to reduce grain size to control the resistivity of the conductor material) and an insulator inside the channel. The conductor forms an ohmic contact with source 220 and with floating gates 270 (and gates 272 in an implementation where they are formed). Thus, channel 280 provides electrical connectivity from source 220 to floating gates 270. In one embodiment, dummy gates 272 can trigger by the same gate select signal as floating gates 270. Thus, dummy gates 272 in ALOX 272 can improve current flow from source 220 into channel 280, which can improve the electrical properties of the resulting circuit. In one embodiment, other decks of tiers of circuit elements can be processed on the circuit shown.

Figure 3:
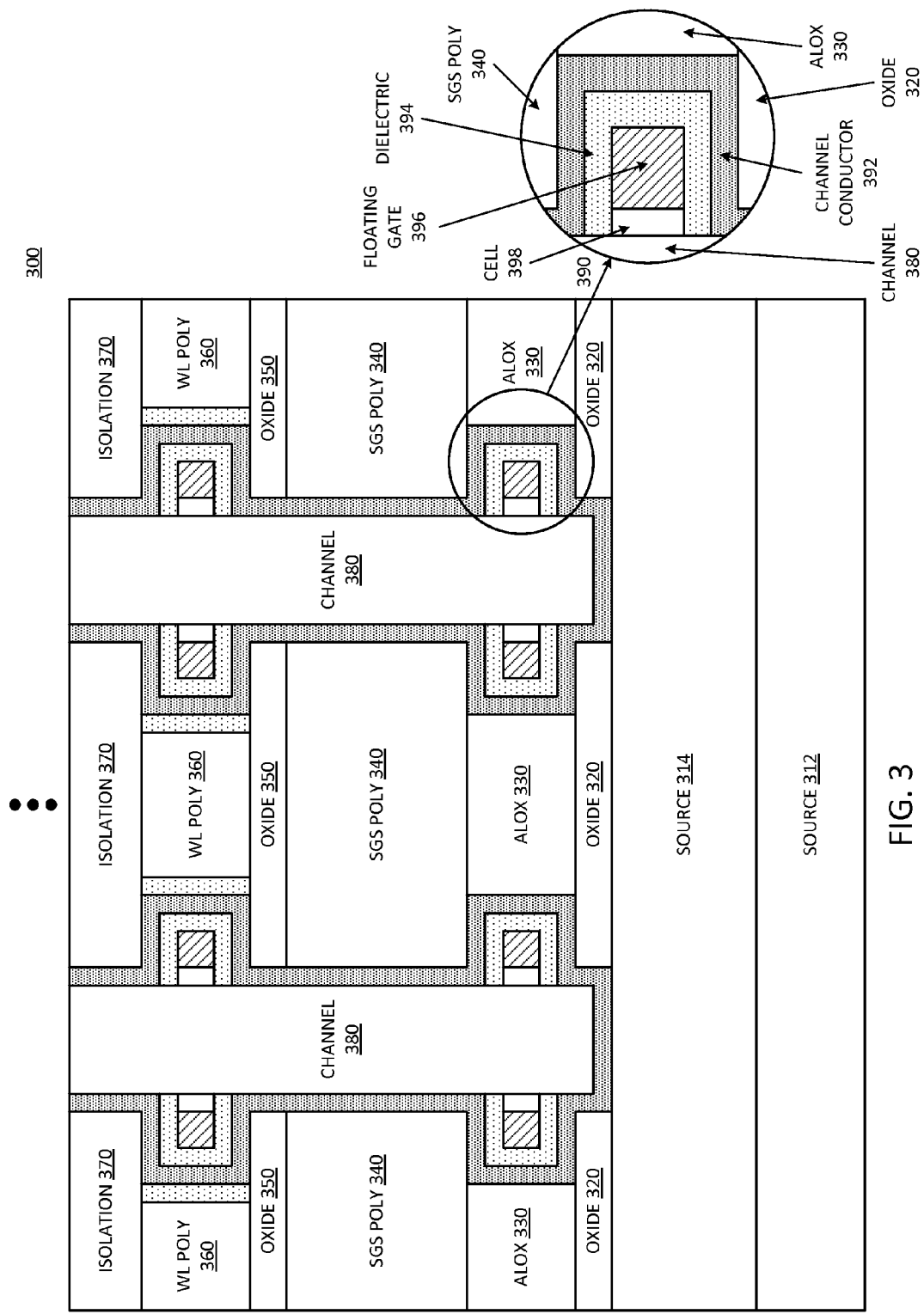
FIG. 3 is a block diagram of an embodiment of a stacked circuit with an AlOx landing layer with a current enhancing floating gate.

FIG. 3 is a block diagram of an embodiment of a stacked circuit with an AlOx landing layer with a current enhancing floating gate. Circuit 300 can be one example of a system 100 of FIG. 1, or of circuit states 202, 204, 206, 208, 210, 212. In particular, circuit 300 provides a representation of a close-up of a processed recess adjacent the conductor channel. The processing creates elements 390 in the recesses.

In one embodiment, circuit 300 includes source layers 312 and 314, which can be an example of source 220. In one embodiment, source 312 is a WSix or other metallic material. In one embodiment, source 314 is a source polycrystalline material (such as an n-type doped polysilicon). It will be understood that the source does not necessarily need two layers of material, and in one embodiment one or the other material can be the source layer.

Circuit 300 includes ALOX layer 330 between SGS poly layer 340 and the source. While not specifically shown, circuit 300 could include an oxide layer between ALOX 330 and SGS poly 340. In one embodiment, circuit 300 includes oxide layer 320 between ALOX 330 and the source. Such an oxide layer (which can be very thin, for example, approximately ⅛ to 1/20 the thickness of ALOX 330) can help prevent possible undercut pillar to pillar shorting during the recessing of ALOX 330. In one embodiment, ALOX 330 can be approximately 40-100 nm thick, and oxide 320 can be approximately 5 nm thick. In one embodiment, SGS poly 340 can be approximately 100-200 nm thick.

In one embodiment, circuit 300 includes oxide 350 to isolate the stack of tiers from SGS poly 340, and includes isolation layer 370 (such as an oxide or nitride) between circuit elements. Each isolation layer 360 can be approximately 20 nm thick. In an implementation of a memory device the circuit elements can be formed as wordline poly 360 with a floating gate and memory cell structure as illustrated. WL poly 360 can be approximately 30 nm thick. Circuit 300 can include any number of tiers that is supported by the processing operations. Depending on the number of tiers, the entire thickness of a deck of circuit elements of circuit 300 from source 312 to a last tier can be approximately 2000-3000 nm, or even more. In addition, in one embodiment, circuit 300 can include multiple stacked decks each having multiple stacked tiers.

The inset to the side of the drawing illustrates a close-up perspective of circuit element 390, which in one embodiment is formed in recesses off channel 380. For perspective, portions of channel 380, SGS poly 340, ALOX 330, and oxide 320 are illustrated. A structure similar to element 390 can also be formed in each tier, as shown in circuit 300. In one embodiment, in the tiers of circuit elements, the tier can include another layer of dielectric 394 to isolate the element from WL poly 360. In one embodiment, channel conductor 392 extends along channel 380 and around the floating gate and cell components of element 390. Element 390 can include dielectric 394 between channel conductor 392 and floating gate 396. In one embodiment, element 390 includes cell 398 adjacent floating gate 396 and dielectric 394. ALOX layer 330 can include a dummy cell that is not addressed, and thus can function like a memory cell, but stores no useful information, and is not accessed for read or write operations. However, activation of element 390 can improve string current and continuity in circuit 300.

Figure 4:
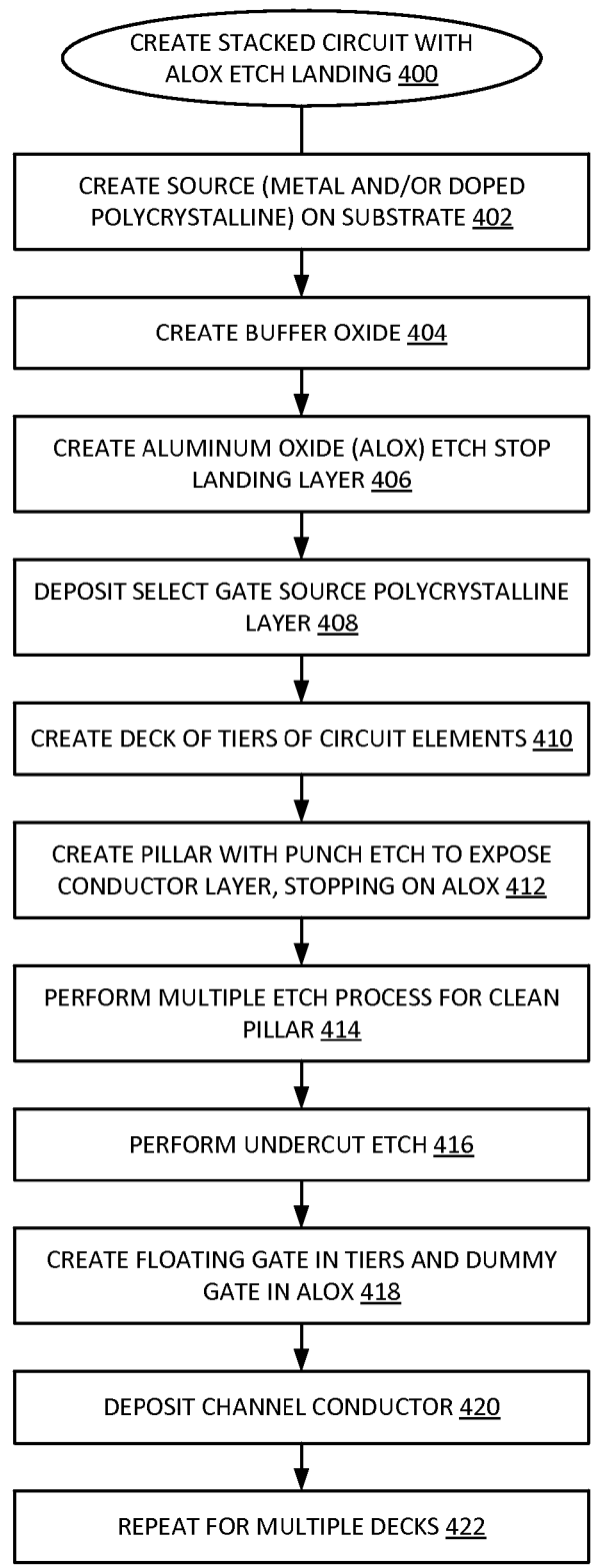
FIG. 4 is a flow diagram of an embodiment of a process for creating a stacked hollow channel circuit with an AlOx landing layer.

FIG. 4 is a flow diagram of an embodiment of a process for creating a stacked hollow channel circuit with an AlOx landing layer. Process 400 can be one example of a process to produce circuits and circuit states such as or similar to those of FIGS. 2A-2F, system 100 of FIG. 1, and/or circuit 300 of FIG. 3. Process 400 can be executed by processing equipment of a manufacturing entity. The manufacturer configures the processing equipment and performs a series of processing steps or operations on a semiconductor wafer to create the electronic circuits. The processing equipment can include tools to perform any type of materials processing operations (deposit, CMP, etch, ion implant, annealing, other). Such processing equipment includes computer equipment and mechanical and electrical tools that perform the processing. The processing equipment is controlled by one or more processing operation controls, which can include hardware logic and/or software/firmware logic to control the processing. The equipment can be programmed or configured to perform certain operations in a certain order. Collectively the equipment and processing or configuration can be referred to as a processing system. For purposes of process 400, the operations are described as being performed by "the processing," which refers indirectly to the manufacturer and the processing system used by the manufacturer.

The processing creates a source layer on or in a semiconductor substrate, such as a silicon wafer, 402. The processing creates an electronic circuit on the source. The source is a conductor that can be activated to create electrical activity in the circuit elements. The source layer can include either a metal material, or a doped polycrystalline material, or both. In one embodiment, the processing deposits a buffer oxide over the source, 404. The buffer oxide is an insulator. The processing creates an AlOx etch stop landing layer, 406. The AlOx layer provides selectivity for both wet etch and dry etch operations, and is a HiK dielectric material. Thus, the AlOx layer can provide the electrical benefits of a HiK material while providing processing benefits (such as those described above) based on its etch selectivity.

The processing deposits or otherwise creates a select gate source polycrystalline layer for the electronic circuit, 408. In one embodiment, the select gate is the gate for all circuit elements in a multitier stack of circuit elements. The processing creates a deck of tiers of circuit elements, 410. In one embodiment, the processing deposits layers or tiers of cells or other circuit elements. In one embodiment, the processing creates the tiers of circuit elements vertically stacked on each other. The tiers of circuit elements can be separated by an oxide material as an inter-tier insulator.

In one embodiment, the processing creates a pillar, such as by a punch etch to expose the source conductor layer below the deck of cells, 412. The pillar will stop on or in the AlOx layer without exposing or pitting the source, because of the high selectivity of the AlOx and the location of the AlOx between the select gate layer and the source layer.

In one embodiment, the processing performs a multiple etch process (or sub-process) that can provide a good profile for the pillar, 414. A good profile for the pillar refers to a pillar profile in which the diameter of the pillar near the source is comparable to the diameter of the pillar near the tiers of the stack. It will be understood that significant variations in the diameter of the pillar creates performance variations in the memory cells or circuit elements of the stack. Thus, a good pillar profile allows all circuit elements of the stack to operate within performance tolerances. In one embodiment, a good pillar profile has a pillar diameter that does not pinch or close off along the length of the pillar from the tier furthest from the source to the layer nearest the source. It will be understood that a dummy cell or a dummy gate created in a recess in the AlOx layer is not considered to change the diameter of the pillar for purposes of evaluating a good profile of the channel.

In one embodiment, the processing performs an undercut etch in the AlOx layer to create a floating gate in the AlOx layer, 416. The processing can then process a floating gate in the tiers of circuit elements as well as in the AlOx layer, 418. The processing can deposit a channel conductor to provide electrical contact along the channel from the source to the multiple tiers of circuit elements, 420. In one embodiment, the processing continues to create multiple decks of multiple tiers of circuit elements, 422.

Figure 5:
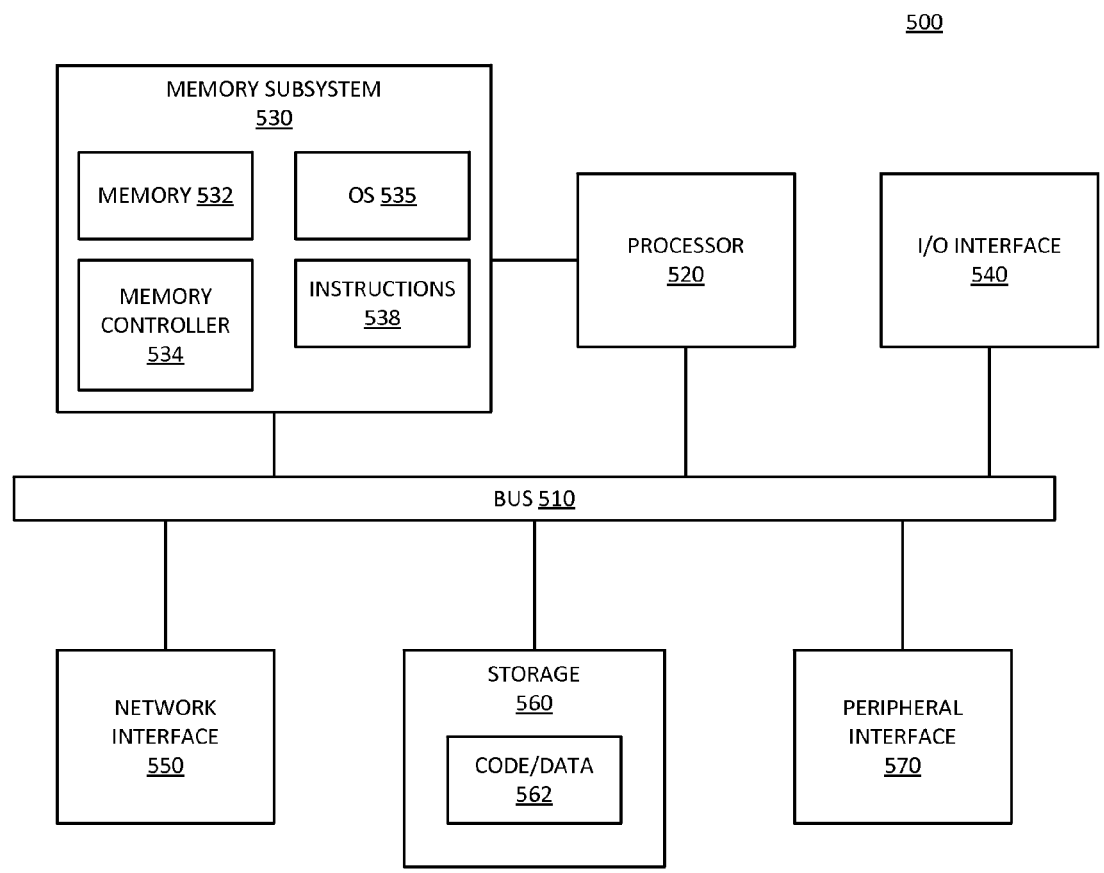
FIG. 5 is a block diagram of an embodiment of a computing system in which a stacked hollow channel circuit with an AlOx landing layer can be implemented.

FIG. 5 is a block diagram of an embodiment of a computing system in which a stacked hollow channel circuit with an AlOx landing layer can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). In one embodiment, I/O interface 540 can include a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. High definition can also refer to projected displays (e.g., head-mounted displays) that have comparable visual quality to pixel displays. Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, memory subsystem 530 (e.g., memory devices 532) and/or other components of system 500 include elements that are created as stacked circuit with conductor channels landing on an AlOx etch stop layer. By creating the circuit elements in vertical tiers, the hardware components of system 500 can be implemented on less real estate than what has traditionally been possible. The conductor channel enables multiple stacked circuit elements to electrically connect to a common source layer. The AlOx layer provides a processing profile that enables the stacked circuits to function across different processing variances.

Figure 6:
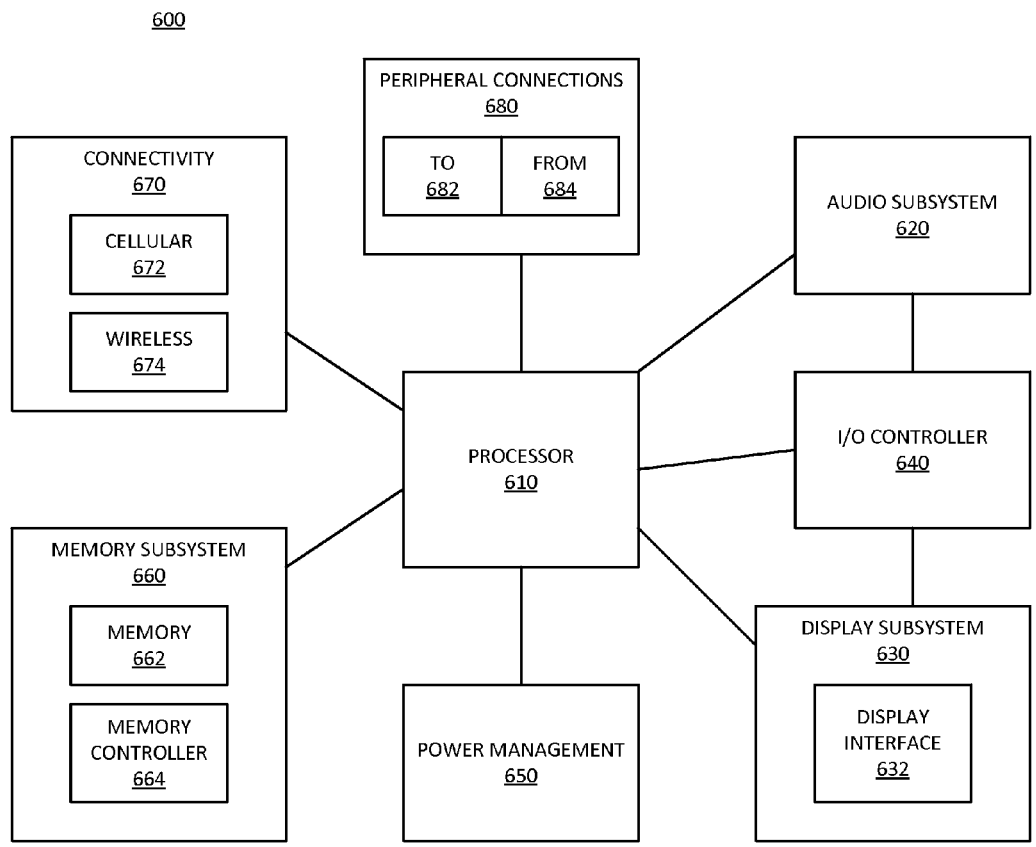
FIG. 6 is a block diagram of an embodiment of a mobile device in which a stacked hollow channel circuit with an AlOx landing layer can be implemented.

FIG. 6 is a block diagram of an embodiment of a mobile device in which a stacked hollow channel circuit with an AlOx landing layer can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user. In one embodiment, display subsystem 630 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. High definition can also refer to projected displays (e.g., head-mounted displays) that have comparable visual quality to pixel displays.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 660 (e.g., memory devices 662) and/or other components of system 600 include elements that are created as stacked circuit with conductor channels landing on an AlOx etch stop layer. By creating the circuit elements in vertical tiers, the hardware components of system 500 can be implemented on less real estate than what has traditionally been possible. The conductor channel enables multiple stacked circuit elements to electrically connect to a common source layer. The AlOx layer provides a processing profile that enables the stacked circuits to function across different processing variances.

In one aspect, a circuit device includes: a multitier stack of memory cells, each tier of the stack including a memory cell device; a source gate select polycrystalline (SGS poly) layer adjacent the multitier stack of memory cells, the SGS poly layer to provide a gate select signal for the memory cells of the multitier stack; a conductive source layer to provide a source conductor for a channel for the tiers of the stack; and an aluminum oxide (AlOx) layer between the source layer and the SGS poly layer, the AlOx layer providing an etch stop layer to separate the SGS poly layer from the source layer, wherein the AlOx layer provides both dry etch selectivity and wet etch selectivity, wherein a channel etch etches through the multitier stack of memory cells and the SGS poly layer, and stops at the AlOx layer and does not expose the source layer, and wherein a selective gate etch etches gate contacts in the memory cells and etches the AlOx layer to expose the source layer.

In one embodiment, the SGS poly layer comprises a p-type doped polysilicon. In one embodiment, the source layer includes one or more of tungsten silicide, heavily doped polysilicon, or poly-tungsten silicide. In one embodiment, the source layer comprises an n-type doped polysilicon. In one embodiment, the AlOx layer further comprises: a floating gate triggered by the gate select signal to provide current from the source layer to the multitier stack of memory cells. In one embodiment, the channel comprises a hollow channel extending through the multitier stack, the hollow channel including conductive material surrounding a channel insulator to provide electrical contact to gates of the memory cells; wherein the AlOx layer floating gate provides current from the source layer to the hollow channel. In one embodiment, further comprising: an oxide layer between the AlOx layer and the SGS poly layer. In one embodiment, further comprising: an oxide layer between the AlOx layer and the source layer.

In one aspect, an electronic device includes: a three-dimensional stacked memory device to store data, the memory device including: a multitier stack of memory cells, each tier of the stack including a memory cell device; a source gate select polycrystalline (SGS poly) layer adjacent the multitier stack of memory cells, the SGS poly layer to provide a gate select signal for the memory cells of the multitier stack; a conductive source layer to provide a source conductor for a channel for the tiers of the stack; and an aluminum oxide (AlOx) layer between the source layer and the SGS poly layer, the AlOx layer providing an etch stop layer to separate the SGS poly layer from the source layer, wherein the AlOx layer provides both dry etch selectivity and wet etch selectivity, wherein a channel etch etches through the multitier stack of memory cells and the SGS poly layer, and stops at the AlOx layer and does not expose the source layer, and wherein a selective gate etch etches gate contacts in the memory cells and etches the AlOx layer to expose the source layer; and a high-definition display coupled to generate a display based on data stored in the memory device.

In one embodiment, the SGS poly layer comprises a p-type doped polysilicon. In one embodiment, the source layer includes one or more of tungsten silicide, heavily doped polysilicon, or poly-tungsten silicide. In one embodiment, the source layer comprises an n-type doped polysilicon. In one embodiment, the AlOx layer further comprises: a floating gate triggered by the gate select signal to provide current from the source layer to the multitier stack of memory cells. In one embodiment, the channel comprises a hollow channel extending through the multitier stack, the hollow channel including conductive material surrounding a channel insulator to provide electrical contact to gates of the memory cells; wherein the AlOx layer floating gate provides current from the source layer to the hollow channel. In one embodiment, the memory device further comprises: an oxide layer between the AlOx layer and the SGS poly layer. In one embodiment, the memory device further comprises: an oxide layer between the AlOx layer and the source layer.

In one aspect, a method for creating a stacked circuit with an AlOx landing layer includes: generating a multitier stack of memory cells, each tier of the stack including a memory cell device; creating a source gate select polycrystalline (SGS poly) layer adjacent the multitier stack of memory cells, the SGS poly layer to provide a gate select signal for the memory cells of the multitier stack; creating a conductive source layer on a semiconductor substrate to provide a source conductor for a channel for the tiers of the stack; and creating an aluminum oxide (AlOx) layer between the source layer and the SGS poly layer, the AlOx layer providing an etch stop layer to separate the SGS poly layer from the source layer, wherein the AlOx layer provides both dry etch selectivity and wet etch selectivity, wherein a channel etch etches through the multitier stack of memory cells and the SGS poly layer, and stops at the AlOx layer and does not expose the source layer, and wherein a selective gate etch etches gate contacts in the memory cells and etches the AlOx layer to expose the source layer.

In one embodiment, creating the SGS poly layer comprises creating a p-type doped polysilicon. In one embodiment, creating the source layer comprises creating a source layer that includes one or more of tungsten silicide, heavily doped polysilicon, or poly-tungsten silicide. In one embodiment, creating the source layer comprises creating an n-type doped polysilicon. In one embodiment, creating the AlOx layer further comprises creating a floating gate to be triggered by the gate select signal to provide current from the source layer to the multitier stack of memory cells. In one embodiment, further comprising creating a hollow channel extending through the multitier stack, the hollow channel including conductive material surrounding a channel insulator to provide electrical contact to gates of the memory cells; wherein the AlOx layer floating gate provides current from the source layer to the hollow channel. In one embodiment, further comprising creating an oxide layer between the AlOx layer and the SGS poly layer. In one embodiment, further comprising creating an oxide layer between the AlOx layer and the source layer.

In one aspect, an article of manufacture comprising a computer readable storage medium having content stored thereon, which when executed performs operations for creating stacked circuit with an AlOx landing layer, including: generating a multitier stack of memory cells, each tier of the stack including a memory cell device; creating a source gate select polycrystalline (SGS poly) layer adjacent the multitier stack of memory cells, the SGS poly layer to provide a gate select signal for the memory cells of the multitier stack; creating a conductive source layer on a semiconductor substrate to provide a source conductor for a channel for the tiers of the stack; and creating an aluminum oxide (AlOx) layer between the source layer and the SGS poly layer, the AlOx layer providing an etch stop layer to separate the SGS poly layer from the source layer, wherein the AlOx layer provides both dry etch selectivity and wet etch selectivity, wherein a channel etch etches through the multitier stack of memory cells and the SGS poly layer, and stops at the AlOx layer and does not expose the source layer, and wherein a selective gate etch etches gate contacts in the memory cells and etches the AlOx layer to expose the source layer.

In one embodiment, the content for creating the SGS poly layer comprises content for creating a p-type doped polysilicon. In one embodiment, the content for creating the source layer comprises content for creating a source layer that includes one or more of tungsten silicide, heavily doped polysilicon, or poly-tungsten silicide. In one embodiment, the content for creating the source layer comprises content for creating an n-type doped polysilicon. In one embodiment, the content for creating the AlOx layer further comprises content for creating a floating gate to be triggered by the gate select signal to provide current from the source layer to the multitier stack of memory cells. In one embodiment, further comprising content for creating a hollow channel extending through the multitier stack, the hollow channel including conductive material surrounding a channel insulator to provide electrical contact to gates of the memory cells; wherein the AlOx layer floating gate provides current from the source layer to the hollow channel. In one embodiment, further comprising content for creating an oxide layer between the AlOx layer and the SGS poly layer. In one embodiment, further comprising content for creating an oxide layer between the AlOx layer and the source layer.

In one aspect, an apparatus for creating stacked circuit with an AlOx landing layer includes: means for generating a multitier stack of memory cells, each tier of the stack including a memory cell device; means for creating a source gate select polycrystalline (SGS poly) layer adjacent the multitier stack of memory cells, the SGS poly layer to provide a gate select signal for the memory cells of the multitier stack; means for creating a conductive source layer on a semiconductor substrate to provide a source conductor for a channel for the tiers of the stack; and means for creating an aluminum oxide (AlOx) layer between the source layer and the SGS poly layer, the AlOx layer providing an etch stop layer to separate the SGS poly layer from the source layer, wherein the AlOx layer provides both dry etch selectivity and wet etch selectivity, wherein a channel etch etches through the multitier stack of memory cells and the SGS poly layer, and stops at the AlOx layer and does not expose the source layer, and wherein a selective gate etch etches gate contacts in the memory cells and etches the AlOx layer to expose the source layer.

In one embodiment, the means for creating the SGS poly layer comprises means for creating a p-type doped polysilicon. In one embodiment, the means for creating the source layer comprises means for creating a source layer that includes one or more of tungsten silicide, heavily doped polysilicon, or poly-tungsten silicide. In one embodiment, the means for creating the source layer comprises means for creating an n-type doped polysilicon. In one embodiment, the means for creating the AlOx layer further comprises means for creating a floating gate to be triggered by the gate select signal to provide current from the source layer to the multitier stack of memory cells. In one embodiment, further comprising means for creating a hollow channel extending through the multitier stack, the hollow channel including conductive material surrounding a channel insulator to provide electrical contact to gates of the memory cells; wherein the AlOx layer floating gate provides current from the source layer to the hollow channel. In one embodiment, further comprising means for creating an oxide layer between the AlOx layer and the SGS poly layer. In one embodiment, further comprising means for creating an oxide layer between the AlOx layer and the source layer.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, appli- Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit device comprising:
a semiconductor substrate with a conductive source layer to provide a source conductor for a channel;
a multitier stack of memory cells, each tier of the multitier stack including a memory cell device;
a source gate select polycrystalline (SGS poly) layer over the source layer and between the multitier stack and the source layer, the SGS poly layer to provide a gate select signal to selectively conduct charge from the source conductor to the memory cell devices; and
an aluminum oxide (AlOx) layer between the source layer and the SGS poly layer, the AlOx layer to provide an etch stop layer to separate the SGS poly layer from the source layer, wherein the AlOx layer to provide both dry etch selectivity and wet etch selectivity, wherein a channel etch is to etch through the multitier stack of memory cells and the SGS poly layer, and stop at the AlOx layer and not expose the source layer, and wherein a selective gate etch is to etch gate contacts in the memory cells and to etch through the AlOx layer to expose the source layer.

2. The circuit device of claim 1, wherein the SGS poly layer comprises a p-type doped polysilicon.

3. The circuit device of claim 1, wherein the source layer includes one or more of tungsten silicide, heavily doped polysilicon, or poly-tungsten silicide.

4. The circuit device of claim 1, wherein the source layer comprises an n-type doped polysilicon.

5. The circuit device of claim 1, wherein the AlOx layer further comprises:
a floating gate to be triggered by the gate select signal to provide current from the source layer to the multitier stack of memory cells.

6. The circuit device of claim 5, wherein the channel comprises a hollow channel extending through the multitier stack, the hollow channel including conductive material surrounding a channel insulator to provide electrical contact to gates of the memory cells;
wherein the floating gate of the AlOx layer is to provide current from the source layer to the hollow channel.

7. The circuit device of claim 1, further comprising:
an oxide layer between the AlOx layer and the SGS poly layer.

8. The circuit device of claim 1, further comprising:
an oxide layer between the AlOx layer and the source layer.

9. An electronic device comprising:
a three-dimensional stacked memory device to store data, the three-dimensional stacked memory device including:
a semiconductor substrate with a conductive source layer to provide a source conductor for a channel;
a multitier stack of memory cells, each tier of the multitier stack including a memory cell device;
a source gate select polycrystalline (SGS poly) layer over the source layer and between the multitier stack and the source layer, the SGS poly layer to provide a gate select signal to selectively conduct charge from the source conductor to the memory cell devices; and
an aluminum oxide (AlOx) layer between the source layer and the SGS poly layer, the AlOx layer to provide an etch stop layer to separate the SGS poly layer from the source layer, wherein the AlOx layer to provide both dry etch selectivity and wet etch selectivity, wherein a channel etch is to etch through the multitier stack of memory cells and the SGS poly layer, and stop at the AlOx layer and not expose the source layer, and wherein a selective gate etch is to etch gate contacts in the memory cells and to etch through the AlOx layer to expose the source layer; and
a high-definition display coupled to generate a display based on data stored in the memory device.

10. The electronic device of claim 9, wherein the source layer includes one or more of tungsten silicide, heavily doped polysilicon, or poly-tungsten silicide.

11. The electronic device of claim 9, wherein the AlOx layer further comprises:
a floating gate to be triggered by the gate select signal to provide current from the source layer to the multitier stack of memory cells.

12. The electronic device of claim 11, wherein the channel comprises a hollow channel extending through the multitier stack, the hollow channel including conductive material surrounding a channel insulator to provide electrical contact to gates of the memory cells;
wherein the floating gate of the AlOx layer is to provide current from the source layer to the hollow channel.

13. The electronic device of claim 9, wherein the three-dimensional stacked memory device further comprises:
an oxide layer between the AlOx layer and the SGS poly layer.

14. The electronic device of claim 9, wherein the three-dimensional stacked memory device further comprises:
an oxide layer between the AlOx layer and the source layer.

* * * * *